(12) United States Patent
Samonji et al.

(10) Patent No.: US 9,385,277 B2
(45) Date of Patent: Jul. 5, 2016

(54) NITRIDE SEMICONDUCTOR LIGHT EMITTING DEVICE

(71) Applicant: Panasonic Intellectual Property Management Co., Ltd., Osaka (JP)

(72) Inventors: Katsuya Samonji, Kyoto (JP); Kazuhiko Yamanaka, Osaka (JP); Shinji Yoshida, Shiga (JP); Hiroyuki Hagino, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/550,145

(22) Filed: Nov. 21, 2014

(65) Prior Publication Data

US 2015/0108518 A1     Apr. 23, 2015

Related U.S. Application Data

(63) Continuation of application No. PCT/JP2013/002346, filed on Apr. 4, 2013.

(30) Foreign Application Priority Data

May 22, 2012    (JP) ................................. 2012-116183

(51) Int. Cl.
*H01L 27/15*       (2006.01)
*H01L 33/32*       (2010.01)
(Continued)

(52) U.S. Cl.
CPC ................. *H01L 33/32* (2013.01); *B82Y 20/00* (2013.01); *H01L 33/16* (2013.01); *H01L 33/483* (2013.01);
(Continued)

(58) Field of Classification Search
CPC ......... H01L 33/32; H01L 33/64; H01L 33/16; H01L 33/145
See application file for complete search history.

(56) References Cited

U.S. PATENT DOCUMENTS

| 5,299,214 A | * | 3/1994 | Nakamura et al. .............. 372/36 |
| 2002/0121863 A1 | | 9/2002 | Morishita |

(Continued)

FOREIGN PATENT DOCUMENTS

| JP | 58-091692 | 5/1983 |
| JP | 59-228778 A | 12/1984 |

(Continued)

OTHER PUBLICATIONS

International Search Report issued in International Application No. PCT/JP2013/002346 mailed Jul. 9, 2013, with English translation.

*Primary Examiner* — Khiem D Nguyen
(74) *Attorney, Agent, or Firm* — McDermott Will & Emery LLP

(57) ABSTRACT

A semiconductor light emitting device includes: a nitride semiconductor light emitting element including a nitride semiconductor substrate having a polar or semipolar surface and a nitride semiconductor multilayer film stacked on the polar or semipolar surface; and a mounting section to which the element is mounted. The nitride semiconductor multilayer film includes an electron block layer. The electron block layer has a smaller lattice constant than the nitride semiconductor substrate. The mounting section includes at least a first mounting section base. The first mounting section base is located close to the nitride semiconductor light emitting element. The first mounting section base has a lower thermal expansion coefficient than the nitride semiconductor multilayer film. The first mounting section base has a lower thermal conductivity than the nitride semiconductor multilayer film.

12 Claims, 10 Drawing Sheets

(51) Int. Cl.
H01L 33/16 (2010.01)
H01L 33/48 (2010.01)
B82Y 20/00 (2011.01)
H01L 33/64 (2010.01)
H01S 5/022 (2006.01)
H01S 5/024 (2006.01)
H01S 5/20 (2006.01)
H01S 5/343 (2006.01)
H01L 33/14 (2010.01)

(52) U.S. Cl.
CPC ............ H01L 33/64 (2013.01); H01S 5/02272 (2013.01); H01S 5/02476 (2013.01); *H01L 33/145* (2013.01); *H01L 33/641* (2013.01); *H01L 2224/48091* (2013.01); *H01S 5/02212* (2013.01); *H01S 5/02469* (2013.01); *H01S 5/2009* (2013.01); *H01S 5/34333* (2013.01)

(56) References Cited

U.S. PATENT DOCUMENTS

| | | | |
|---|---|---|---|
| 2005/0167690 A1 | 8/2005 | Gardner et al. | |
| 2007/0290230 A1 | 12/2007 | Kawaguchi et al. | |
| 2010/0148145 A1* | 6/2010 | Ishibashi et al. | ........ 257/13 |
| 2010/0219419 A1 | 9/2010 | Hata et al. | |
| 2011/0272670 A1 | 11/2011 | Kawaguchi et al. | |
| 2012/0104355 A1* | 5/2012 | Grandusky | ........ H01L 21/02389 257/13 |
| 2012/0112204 A1* | 5/2012 | Kyono et al. | ........ 257/76 |
| 2013/0223463 A1 | 8/2013 | Kawaguchi et al. | |

FOREIGN PATENT DOCUMENTS

| | | |
|---|---|---|
| JP | 4-036473 B2 | 6/1992 |
| JP | 10-215022 A | 8/1998 |
| JP | 2002-261376 A | 9/2002 |
| JP | 2002-299744 A | 10/2002 |
| JP | 2002-329896 A | 11/2002 |
| JP | 2003-309316 A | 10/2003 |
| JP | 2004-186527 A | 7/2004 |
| JP | 2005-217421 A | 8/2005 |
| JP | 2007-005473 A | 1/2007 |
| JP | 2010-272593 A | 12/2010 |
| WO | 2005/034301 A1 | 4/2005 |

* cited by examiner

Po=5w (1W PER EMITTER)
PHOTOELECTRIC CONVERSION EFFICIENCY 25%
THERMAL RESISTANCE Rth=13K/W
Tc=25°C

NITRIDE SEMICONDUCTOR LIGHT EMITTING DEVICE

CROSS-REFERENCE TO RELATED APPLICATIONS

This is a continuation of International Application No. PCT/JP2013/002346 filed on Apr. 4, 2013, which claims priority to Japanese Patent Application No. 2012-116183 filed on May 22, 2012. The entire disclosures of these applications are incorporated by reference herein.

BACKGROUND

In recent years, as energy saving of apparatuses has advanced, attention has been given to nitride semiconductor light emitting devices including nitride semiconductor light emitting elements such as light emitting diodes using nitride semiconductors and semiconductor lasers. For example, a light source obtained by combining a nitride semiconductor light emitting device and fluorescent material, etc. can output white light at high power, and has features such as a small size, high efficiency, long life as compared to conventional incandescent lamps, fluorescent lamps, and high pressure mercury lamps. Therefore, the conventional lamps have been rapidly replaced with such light sources as light sources used for display devices such as projectors, liquid crystal backlights, etc.

On the other hand, nitride semiconductor light emitting elements having waveguides, typified by nitride semiconductor lasers, have such a feature that directivity indicating a light emitting direction is high. Thus, industrial application of nitride semiconductor light emitting devices including such nitride semiconductor light emitting elements has also advanced. For example, practical use of laser scribe devices and laser annealing devices using the nitride semiconductor light emitting devices as light sources has been considered. High light output at a watt class higher than or equal to one watt is required for light sources used for such devices. Therefore, the output of the nitride semiconductor light emitting device has also to be increased.

A light emitting element such as a nitride semiconductor light emitting element emits light through recombination of electrons and holes (electron-hole pairs) injected into an active layer formed by, for example, a quantum well of the light emitting device. At this time, energy which has not been converted to the light results in Joule heat, which increases the temperature of the element. In order to increase the output of the nitride semiconductor light emitting device, the amount of applied current (electrons, holes) has to be increased. However, an increase in current increases heat generated in the nitride semiconductor light emitting element. The heat generation increases the temperature of the element, which causes a phenomenon in which some of the electrons or the holes are not injected into the active layer, and overflow (a phenomenon called carrier overflow). In this case, light output is no longer increased even when the amount of the current is increased, and eventually, a phenomenon in which the light output is saturated (optical saturation) occurs. Thus, in order to obtain the high light output, it is required to reduce an increase in chip temperature and reduce the carrier overflow to efficiently convert the electron-hole pairs to light.

Therefore, to reduce such carrier overflow, a layer having a large energy band gap is inserted near an active layer in a conventional technique. International Patent Publication No. WO 2005/034301 (hereinafter referred to as Document 1) describes a configuration of a conventional nitride semiconductor laser. FIG. 17A is a view illustrating the configuration of the conventional nitride semiconductor laser. FIG. 17B illustrates part of an energy band gap of the conventional nitride semiconductor laser, the part being close to a conduction band.

As illustrated in FIG. 17A, the conventional configuration of the nitride semiconductor laser has a stacked structure obtained by stacking an n-AlGaN clad layer 1003, an InGaN active layer 1005, a p-AlGaN electron overflow suppressing layer 1010 (which is referred to as an electron block layer in the present specification), a p-AlGaN clad layer 1011, and a p-GaN contact layer 1012 on a GaN substrate 1001 and an n-GaN layer 1002.

The electron block layer 1010 is a layer provided to prevent electrons injected from the n-GaN layer 1002 from overflowing from the active layer 1005 into the p-AlGaN clad layer 1011. As illustrated in FIG. 17B, the electron block layer 1010 has a larger energy band gap than the layers in the periphery of the electron block layer 1010. In order to increase the energy band gap, an AlGaN layer having a high Al content is used as the electron block layer 1010.

On the other hand, a piezoelectric field may be induced in the nitride semiconductor due to lattice mismatch strain. The lattice constant of the above-described p-AlGaN electron block layer 1010 is smaller than the lattice constant of the GaN substrate 1001. Therefore, tensile strain is induced in the p-AlGaN electron block layer 1010, and the tensile strain causes the piezoelectric field. The piezoelectric field reduces the effect of confining electrons by the p-AlGaN electron block layer.

Japanese Unexamined Patent Publication No. 2005-217421 (hereinafter referred to as Document 2) describes that a piezoelectric field reduces the effective height of a barrier against electrons. Thus, Document 2 proposes increasing the thickness of a p-AlGaN block layer for confinement of the electrons. When the thickness of the AlGaN layer is increased, elastic lattice mismatch strain is reduced by dislocation or the occurrence of cracks. Thus, the piezoelectric field caused by the lattice mismatch strain is reduced, thereby increasing the height of the barrier against electrons of a conduction band.

However, the dislocation or plastic deformation such as the cracks significantly influences the characteristics and the reliability of the element. In particular, the AlGaN layer on the GaN substrate has the tensile strain, and thus cracks are likely to occur. In the periphery of the cracks, a surface of a wafer is not flat, so that fabrication of normal elements becomes difficult.

SUMMARY

As described above, in the light emitting element using the nitride semiconductor, the influence of the piezoelectric field caused by the lattice mismatch strain reduces the effect of reducing the carrier overflow. This phenomenon commonly occurs when a polar surface typified by the (0001) plane is a principal surface of a nitride semiconductor light emitting element structure. In order to increase the effective height of the barrier against the electrons of the conduction band, the Al content of the AlGaN layer having a function of confining the electrons has to be increased. However, when the Al content is increased, the lattice mismatch strain increases, which causes a problem similar to the problem where dislocation and cracks are likely to occur as described in Document 2.

The present disclosure provides a nitride semiconductor light emitting device in which the influence of a piezoelectric field is reduced without plastic deformation, and the carrier overflow in the nitride semiconductor light emitting element can be effectively reduced. That is, a configuration of a nitride semiconductor light emitting device capable of operating at high power can be provided.

The inventors of the present application focused attention on the relationship between the piezoelectric field formed in the electron block layer in the nitride semiconductor light emitting element and the configuration of the nitride semiconductor light emitting device including the nitride semiconductor light emitting element. Specifically, the inventors found that even when the temperature of the element rises, the carrier overflow can be effectively reduced by controlling the thermal expansion coefficient of a submount to which the nitride semiconductor light emitting element is mounted. Inventors then found a configuration of the nitride semiconductor light emitting device to increase the light output.

Specifically, a semiconductor light emitting device of the present disclosure includes: a nitride semiconductor light emitting element including a nitride semiconductor substrate having a polar or semipolar surface and a nitride semiconductor multilayer film stacked on the polar or semipolar surface; and a mounting section to which the nitride semiconductor light emitting element is mounted. In the semiconductor light emitting device, the nitride semiconductor multilayer film includes an electron block layer, a lattice constant of the electron block layer is smaller than a lattice constant of the nitride semiconductor substrate, the mounting section includes at least a first mounting section base, a thermal expansion coefficient of the first mounting section base is lower than a thermal expansion coefficient of the nitride semiconductor multilayer film, and a thermal conductivity of the first mounting section base is higher than a thermal conductivity of the nitride semiconductor multilayer film.

With this configuration, a nitride semiconductor light emitting device in which even when the temperature of the element rises due to electric conduction, the carrier overflow can be effectively reduced and the light output can be increased can be obtained with low costs. Here, the mounting section may include only the first mounting section base.

The thermal expansion coefficient of the first mounting section base may be lower than or equal to $4 \times 10^{-6} K^{-1}$, and the thermal conductivity of the first mounting section base may be higher than or equal to 300 W/mK.

With this configuration, even when the temperature of the element is increased, the carrier overflow can be effectively and more reliably reduced, so that the light output can be increased.

The mounting section may include a second mounting section base made of a material different from a material of the first mounting section base and connected to the first mounting section base, and the first mounting section base may be located closer to the nitride semiconductor light emitting element than the second mounting section base is.

With this configuration, when the first mounting section base is made of a high-cost material, the above-described effect can be obtained with the amount of use of the material being reduced.

The first mounting section base may be made of high thermal conductivity SiC ceramic, CVD-diamond, or a composite material of diamond and copper.

With this configuration, heat resistance from the nitride semiconductor light emitting element to a heat sink is effectively reduced, so that a reduction in light output due to a temperature rise can be inhibited.

The thermal expansion coefficient of the first mounting section base may be lower than or equal to $3 \times 10^{-6} K^{-1}$.

With this configuration, sufficient compression strain is induced in the nitride semiconductor light emitting element, so that the light output can be effectively increased.

Joule heat of the nitride semiconductor light emitting element may be greater than or equal to 3 W.

The nitride semiconductor light emitting device of the present disclosure exhibits a significant effect in particular in such a case where the light output is high and the amount of heat generation is large.

The nitride semiconductor light emitting element may be a semiconductor laser element.

In the semiconductor laser element, confinement of injected carriers in the active layer significantly influences light emitting characteristics. Therefore, the configuration can significantly improve the high output characteristics of the semiconductor laser.

The nitride semiconductor light emitting element may be a light emitting diode.

With this configuration, during high-current operation involving a temperature rise, high light output can be effectively obtained.

The thermal expansion coefficient of the first mounting section base may be lower than a thermal expansion coefficient of the second mounting section base.

With this configuration, sufficient compression strain can be induced in the nitride semiconductor light emitting element, so that the light output can be effectively increased.

A volume of the first mounting section base may be larger than a volume of the nitride semiconductor light emitting element.

With this configuration, sufficient compression strain is induced in the nitride semiconductor light emitting element, so that the light output can be effectively increased. Moreover, the fabrication cost can be significantly reduced.

The mounting section may be a submount mounted to an element mounting board or a base.

The first mounting section base may be an uppermost mounting section base of the mounting section.

With this configuration, a nitride semiconductor light emitting element is mounted to a submount which is, for example, rectangular parallelepiped and can thus be formed easily, and the nitride semiconductor light emitting element mounted to the submount can further be mounted to an element mounting board, a base, a stem, etc. Thus, this configuration is possible even when the processability of the material forming the mounting section is low.

According to the configuration of the present disclosure, a nitride semiconductor light emitting device in which even when the temperature of the element rises due to electric conduction, the carrier overflow can be effectively reduced and the light output can be increased can be obtained with low costs.

DETAILED DESCRIPTION

Embodiments of the present disclosure will be described below with reference to the drawings.

(First Embodiment)

Figure 1:
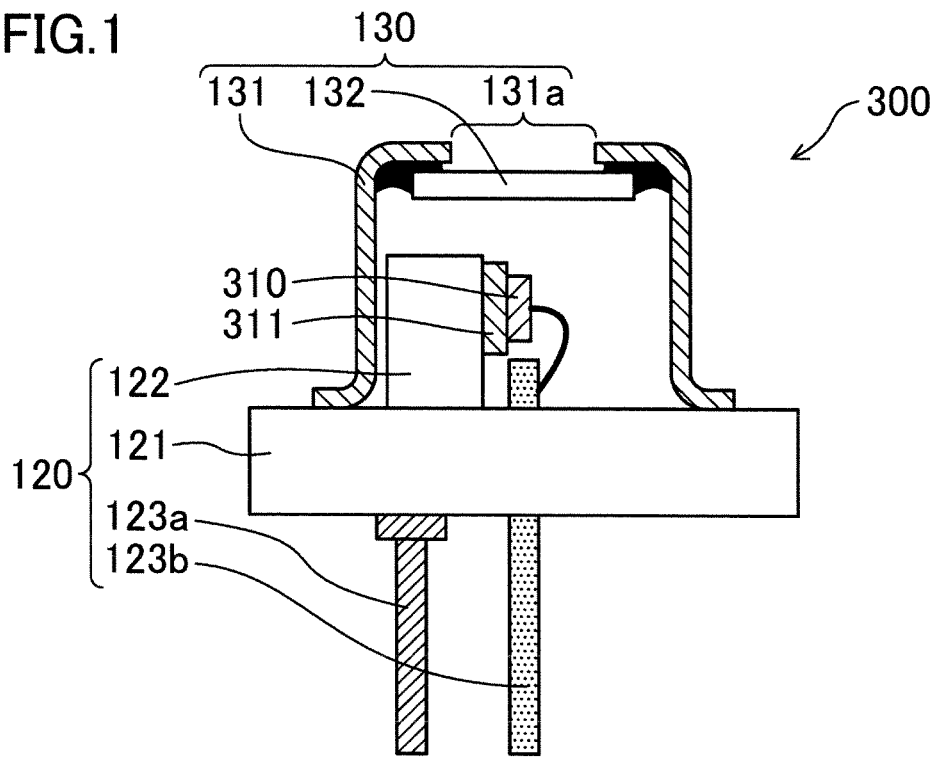
FIG. 1 is a cross-sectional view illustrating a configuration of a nitride semiconductor light emitting device of a first embodiment.
Figure 2:
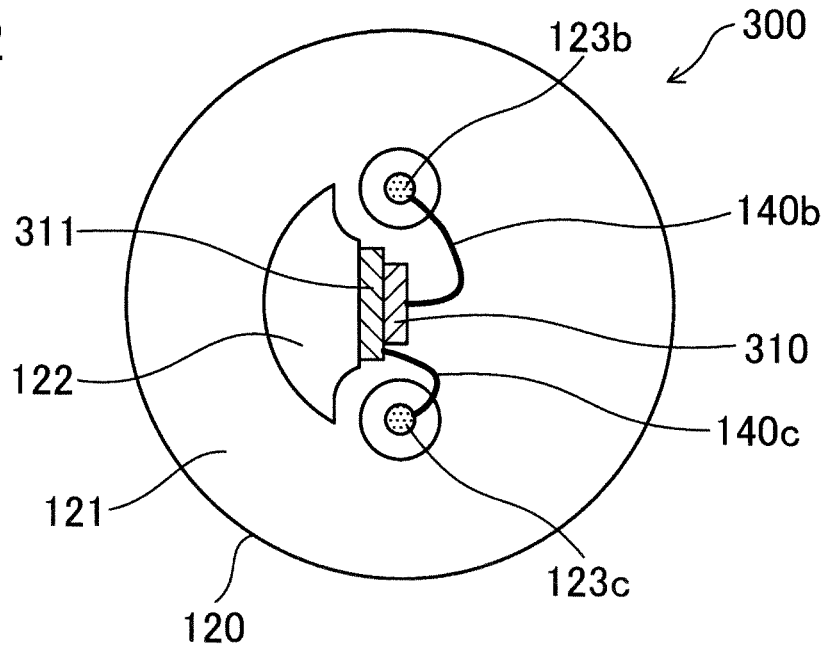
FIG. 2 is a top view illustrating the configuration of the nitride semiconductor light emitting device of the first embodiment.

FIGS. 1 and 2 illustrate a configuration of an example nitride semiconductor light emitting device 300 of the present embodiment. FIG. 1 is a cross-sectional view illustrating the nitride semiconductor light emitting device, and FIG. 2 is a top view illustrating the nitride semiconductor light emitting device as seen from a direction in which light is emitted (as viewed from above in FIG. 1).

The nitride semiconductor light emitting device 300 of the present embodiment includes a nitride semiconductor light emitting element 310 configured to emit a laser beam having a main wavelength within the range, for example, from 390 nm to 550 nm, a submount 311 to which the nitride semiconductor light emitting element 310 is mounted, a stem 120, and a cap 130.

The stem 120 includes a base 121, an element mounting board 122, a lead pin 123a for ground, and leads 123b and 123c. The nitride semiconductor light emitting element 310 and the submount 311 are adhered to the element mounting board 122. The nitride semiconductor light emitting element 310 is electrically connected to the leads 123b and 123c via bonding wires 140b and 140c, respectively. In the present embodiment, a positive electrode is connected from a p electrode of an upper surface of the nitride semiconductor light emitting element 310 to the lead 123b by the bonding wire 140b. A negative electrode is connected from a first electrode formed on a surface of the submount 311 to the lead 123c by the bonding wire 140c. The cap 130 includes a cover 131 having an opening 131a, and a light extraction window 132. The cap 130 is welded to the base 121 of the stem. With this configuration, the nitride semiconductor light emitting element 310 is hermetically sealed.

Figure 3:
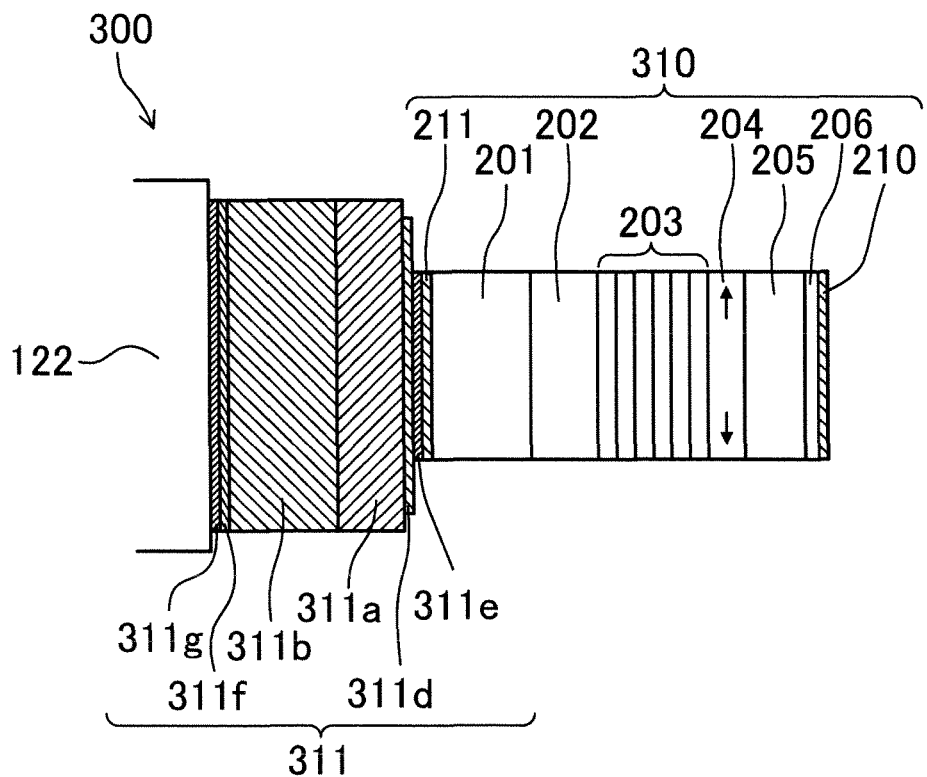
FIG. 3 is a cross-sectional view illustrating configurations of a nitride semiconductor light emitting element and a submount of the first embodiment.

Subsequently, with reference to FIG. 3, the configuration of the nitride semiconductor light emitting device 300 will be described in detail. FIG. 3 illustrates a stacked structure of the nitride semiconductor light emitting element 310 and the submount 311 in detail. First, a typical structure and a typical production method of the nitride semiconductor light emitting element 310 will be described below.

The nitride semiconductor light emitting element 310 includes a nitride semiconductor multilayer film formed on a nitride semiconductor substrate 201 serving as an n-GaN (0001) substrate by metal organic chemical vapor deposition (MOCVD). More specifically, on the nitride semiconductor substrate 201, an n-AlGaN clad layer 202, an active layer 203 including three types of layers, i.e., an n-GaN guide layer, an InGaN multiple quantum well, and a p-GaN guide layer, an AlGaN electron block layer 204 having an Al composition ratio as high as, for example, 15-30%, a p-AlGaN clad layer 205, and a p-GaN contact layer 206 are sequentially stacked. Here, the plane orientation of a surface of the nitride semiconductor substrate 201 is not limited to (0001) as long as a polar or semipolar plane is included. The composition of the AlGaN electron block layer 204 is not limited to the above-described composition as long as the AlGaN electron block layer 204 has a smaller lattice constant than the substrate of the nitride semiconductor light emitting element.

On a surface of the stacked structure, one or more ridge waveguides (not shown) are formed by a dry etching process. A p-ohmic electrode 210 made of, for example, Pd/Pt/Au is formed on a surface of the contact layer 206. An n-ohmic electrode 211 made of, for example, Ti/Pt/Au is formed on a back face of the nitride semiconductor substrate 201. The ridge waveguides are cleaved to a length of, for example, 800 µm to form a Fabry-Perot resonator, thereby functioning as a laser structure.

Subsequently, the submount 311 will be described. The submount 311 includes a first submount base 311a and a second submount base 311b. For example, MN ceramic which can be fabricated with relatively low costs can be used as the second submount base 311b. On a surface of the second submount base 311b, diamond is deposited by CVD to form the first submount base 311a, thereby forming the submount 311 having a two-layer structure. Using such a composite material as the submount can increase the thermal conductivity of the submount and reduce the thermal expansion coefficient of the submount.

A first electrode 311d and a second electrode 311f each having a metal stacked structure obtained by stacking, for example, a Ti layer having a thickness of 0.1 µm, a Pt layer having a thickness of 0.2 µm, and an Au layer having a thickness of 0.2 µm are respectively formed on the surface and a back face of the submount 311.

A first adhesion section 311e which is, for example, AuSn eutectic solder is formed on the first electrode 311d to adhere the submount 311 to the nitride semiconductor light emitting element 310. A second adhesion section 311g which is, for example, AuSn eutectic solder is formed on the second electrode 311f of the submount 311 to adhere the submount 311 to the element mounting board 122 of the stem 120.

In the above configuration, the thickness of the first submount base 311a and the thickness of the second submount base 311b are 10 times as large as the thickness of the first electrode 311d and the thickness of the second electrode 311f, respectively. Thus, the thermal expansion coefficients of the two submount bases 311a, 311b predominate in the thermal expansion coefficient of the submount 311. The configuration of the nitride semiconductor light emitting device of the present embodiment has been described. The nitride semiconductor light emitting device of the present embodiment was operated. In this case, it was possible to effectively reduce the carrier overflow even when the temperature of the element rises due to electric conduction. Thus, the light output was successfully increased.

Next, with reference to FIGS. 4-10, results of an experiment conducted by the inventors of the present application to verify the effect of the nitride semiconductor light emitting device of the present embodiment will be described.

Figure 4:
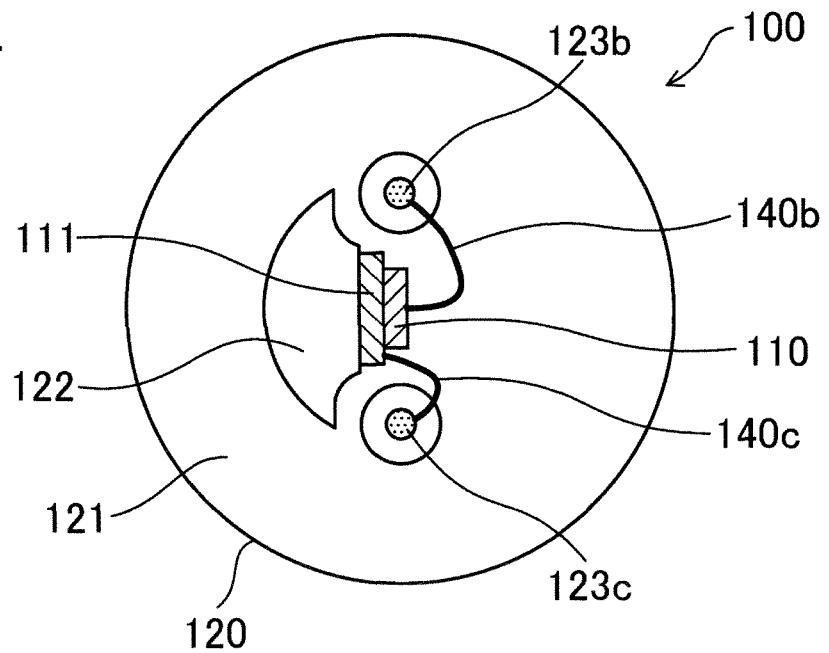
FIG. 4 is a top view illustrating a configuration of a nitride semiconductor light emitting device used to verify the effect of the present disclosure.

FIG. 4 is a view illustrating a nitride semiconductor light emitting device 100 fabricated by the inventors of the present application to verify the effect of the present embodiment. The shape and elements of the nitride semiconductor light emitting device 100 are identical with those of the nitride semiconductor light emitting device 300 illustrated in FIGS. 1 and 2. In FIG. 4, the cap 130 is omitted, and the nitride semiconductor light emitting device 100 is illustrated in a top view as seen from a direction in which light is emitted.

Figure 5A:
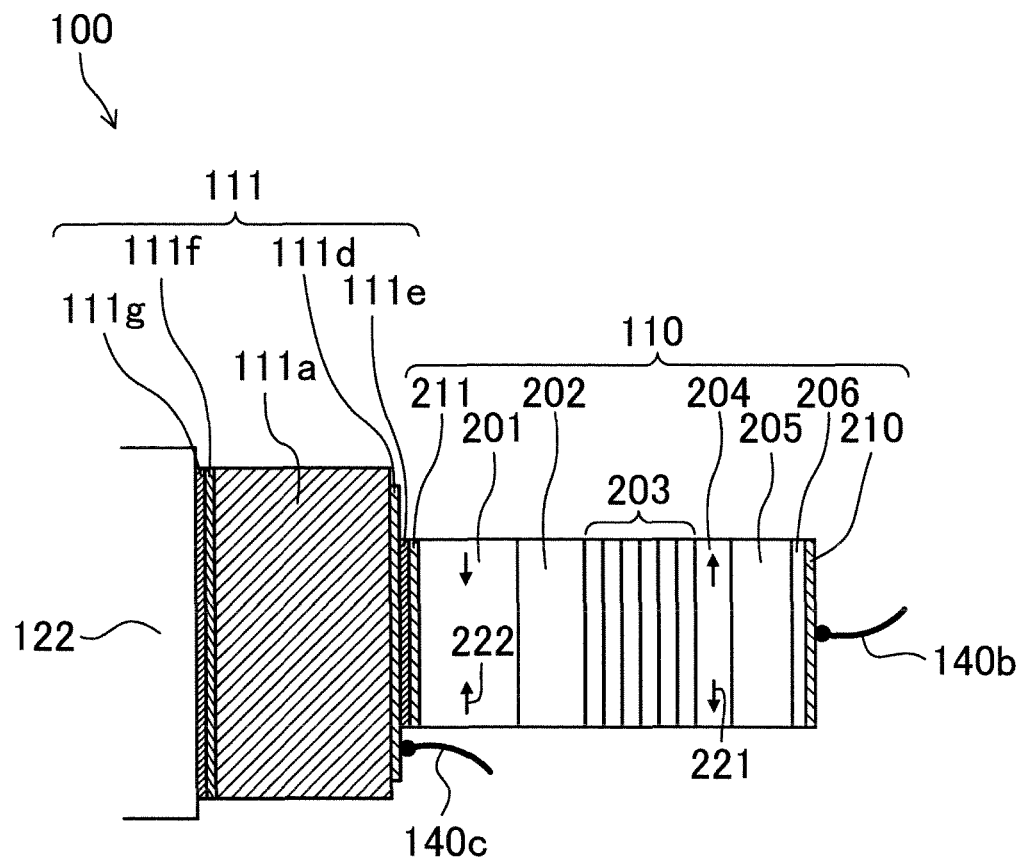
FIG. 5A is a cross-sectional view illustrating a configuration of a nitride semiconductor light emitting element.
Figure 5B:
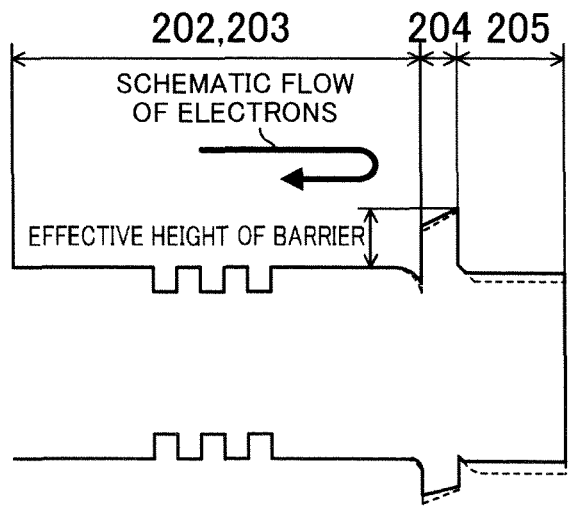
FIG. 5B is a cross-sectional view illustrating a band lineup during electric conduction of the nitride semiconductor light emitting element.

FIGS. 5A and 5B are a view illustrating a detailed structure in the periphery of a nitride semiconductor light emitting element 110 of the nitride semiconductor light emitting device 100 and a view illustrating a configuration of an energy band gap (hereinafter referred to as a band lineup) of the nitride semiconductor light emitting device 100. The structure of the nitride semiconductor light emitting element 110 is identical with that of the nitride semiconductor light emitting element 310 of FIG. 3 except that a submount 111 includes a single submount base 111a.

Figure 6A:
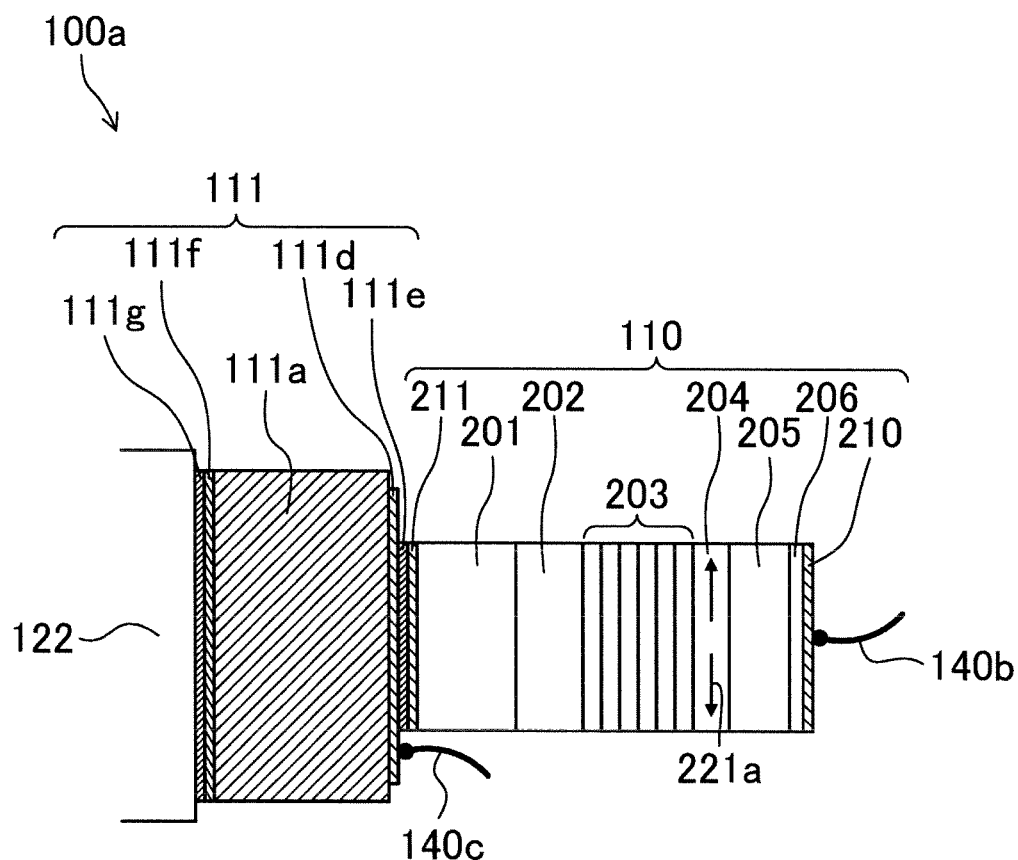
FIG. 6A is a cross-sectional view illustrating a configuration of a nitride semiconductor light emitting element.
Figure 6B:
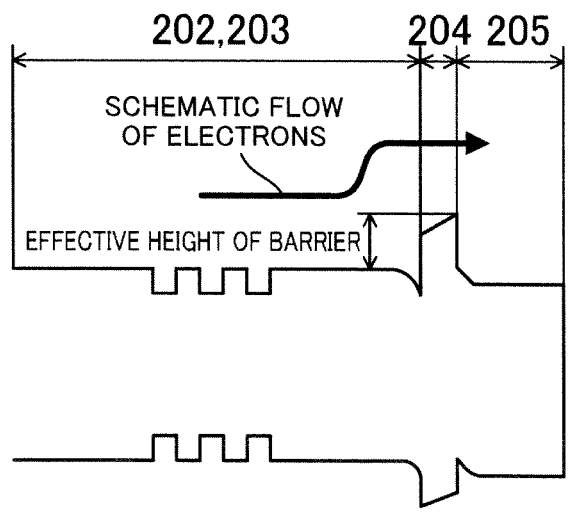
FIG. 6B is a cross-sectional view illustrating a band lineup of the nitride semiconductor light emitting element.

FIGS. 6A and 6B are views illustrating the function of a nitride semiconductor light emitting device 100a. The nitride semiconductor light emitting device 100a is identical with the nitride semiconductor light emitting device 100 of FIGS. 5A and 5B except the material of a submount base 111a of the nitride semiconductor light emitting device 100a.

Table 1 is a list showing the characteristics of materials applicable to submount materials which will be described later.

Figure 7:
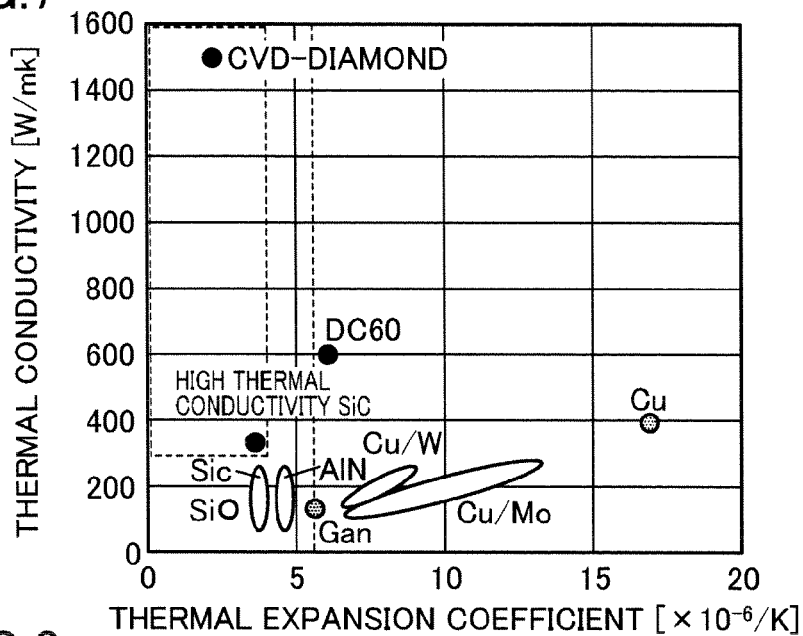
FIG. 7 is a view illustrating the relationship between the thermal expansion coefficient and the thermal conductivity of materials applicable to a submount material of the nitride semiconductor light emitting device.

FIG. 7 is a view illustrating the characteristics of the materials of Table 1.

Table 2 is a list showing the characteristics of the submount materials studied in the present embodiment.

Figure 8:
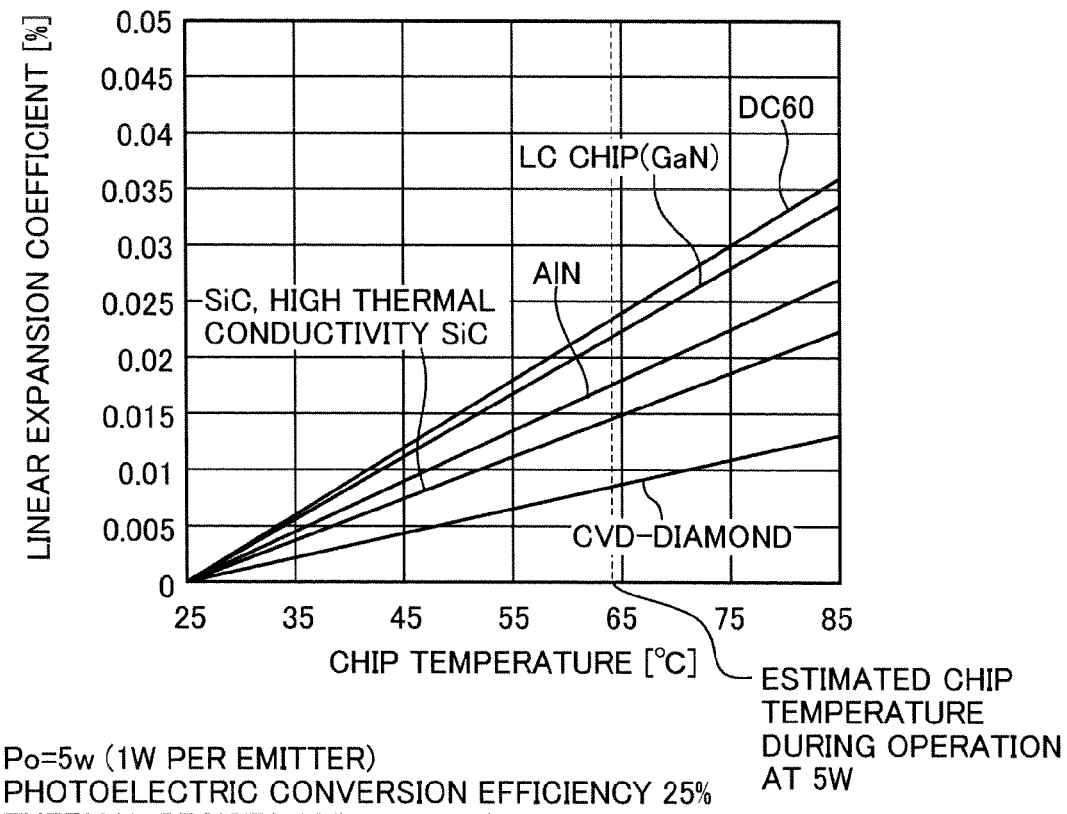
FIG. 8 is a view illustrating the thermal expansion of the submount and the nitride semiconductor light emitting element used in the nitride semiconductor light emitting device at the time of a temperature rise.

FIG. 8 shows computation results illustrating the effect of the nitride semiconductor light emitting device of the present embodiment.

Table 3 is a list showing the computation results illustrating the effect of the present embodiment.

Figure 9:
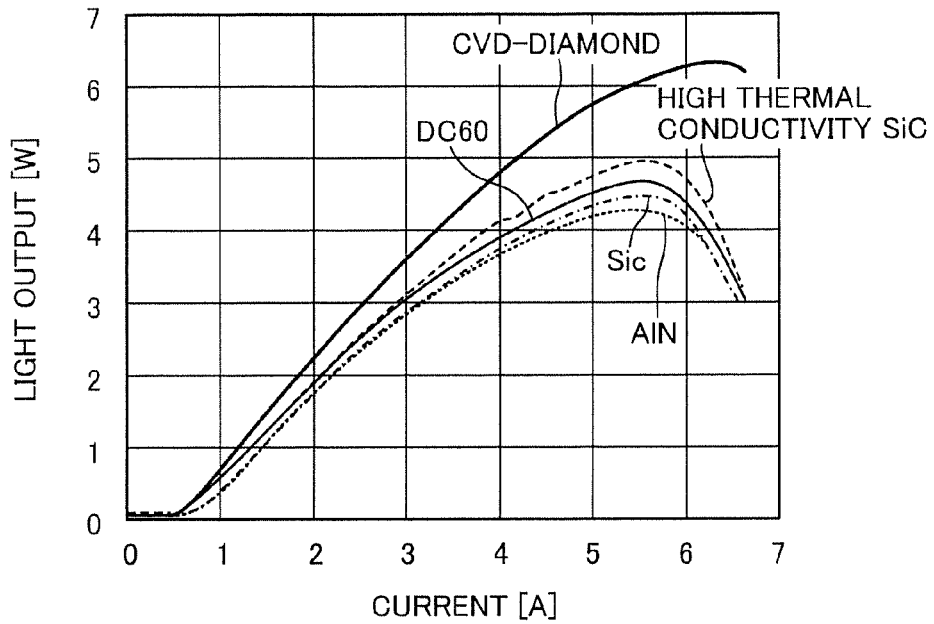
FIG. 9 is a view illustrating the photoelectric conversion efficiency of the nitride semiconductor light emitting device.
Figure 10:
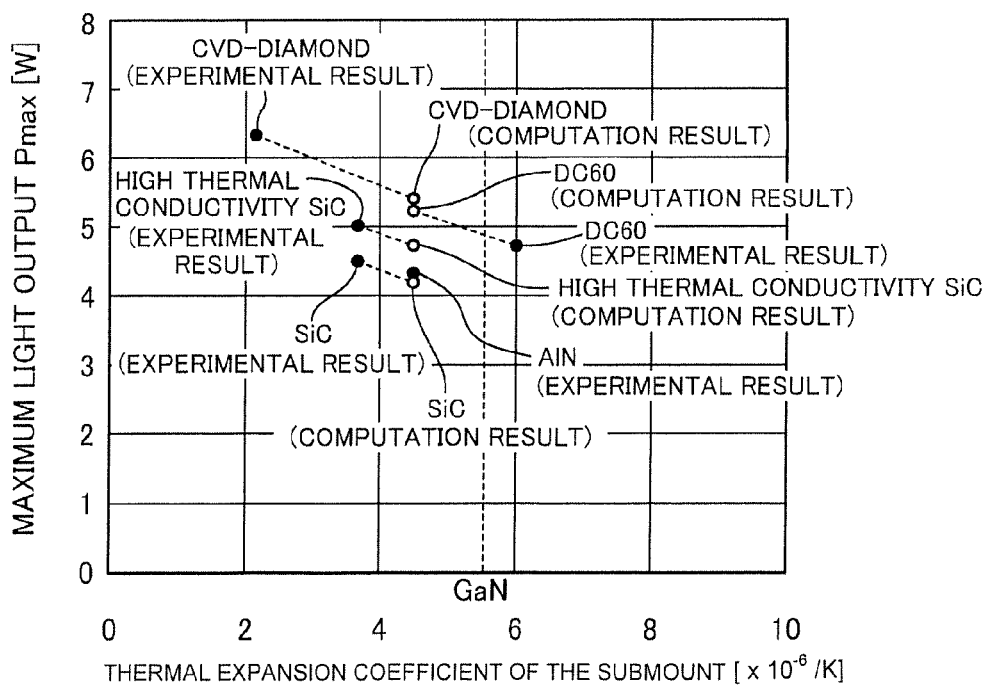
FIG. 10 is a view illustrating comparison between measured values and computed values of the maximum light output of nitride semiconductor light emitting devices.

FIGS. 9 and 10 are views of experimental results illustrating the effect of the nitride semiconductor light emitting device 100 of the present embodiment.

Table 4 is a list of experimental results of the nitride semiconductor device which illustrate the effect of the present embodiment.

Here, the configuration of the submount 111 used in the nitride semiconductor light emitting device 100 will be described. The submount 111 is made of the submount base 111a including, for example, SiC ceramic or diamond formed by chemical vapor deposition (CVD). A first electrode 111d and a second electrode 111f each having a metal stacked structure obtained by stacking, for example, a Ti layer having a thickness of 0.1 μm, a Pt layer having a thickness of 0.2 μm, and an Au layer having a thickness of 0.2 μm are respectively formed on a surface and a back face of the submount 111.

A first adhesion section 111e which is, for example, AuSn eutectic solder is formed on the first electrode 111d to adhere the submount base 111a to the nitride semiconductor light emitting element 110. A second adhesion section 111g which is, for example, AuSn eutectic solder is formed on the second electrode 111f of the submount 111 to adhere the submount base 111a to an element mounting board 122 of a stem 120.

In the above configuration, the thickness of the submount base 111a is 20 times as large as the thickness of the first electrode 111d and the second electrode 111f. Thus, the thermal expansion coefficient of the submount base 111a predominates in the thermal expansion coefficient of the submount 111.

Subsequently, with reference to FIGS. 5A, 5B and FIGS. 6A, 6B, the function of the nitride semiconductor light emitting device of the present embodiment will be described.

FIG. 5B shows the band lineup of the nitride semiconductor light emitting element 110 of FIG. 5A. FIGS. 6A and 6B respectively show a detailed stacked structure and the band lineup of the comparative nitride semiconductor light emitting device 100a, and are used to illustrate the function of the nitride semiconductor light emitting device of the present embodiment.

The material of the submount base 111a of the nitride semiconductor light emitting device 100a is different from that of the nitride semiconductor light emitting device 100 so that the thermal expansion coefficient of the submount base 111a of the nitride semiconductor light emitting device 100a is equal to the thermal expansion coefficient of a nitride semiconductor light emitting element 110 of the nitride semiconductor light emitting device 100a. Thus, stress applied to the nitride semiconductor light emitting element 110 of the nitride semiconductor light emitting device 100a is different from stress applied to the nitride semiconductor light emitting element 110 of the nitride semiconductor light emitting device 100.

First, in the nitride semiconductor light emitting device 100a illustrated in FIG. 6A, directions and the magnitude of strain 221a in an electron block layer 204 are qualitatively indicated by arrows in FIG. 6A. Here, the direction of each arrow indicates a direction of the strain, and the length of each arrow indicates a magnitude of the strain. As described above, the lattice constant of the electron block layer 204 made of AlGaN is smaller than the lattice constant of the nitride semiconductor substrate 201 made of GaN. Thus, lattice mismatch strain in a pulling direction is induced in the electron block layer 204.

Subsequently, the band lineup of the nitride semiconductor light emitting device 100a in the case of application of a forward bias is schematically illustrated in FIG. 6B. Here, numerals 202-205 indicate the correspondence between the band lineup and layers included in the nitride semiconductor light emitting element 110 (i.e., a clad layer 202, an active layer 203, an electron block layer 204, and a clad layer 205).

In the element during electric conduction, electrons are injected from the nitride semiconductor substrate 201 into the active layer, and holes are injected from a contact layer 206 to the active layer. At this time, in the nitride semiconductor, the density of state of the conduction band is lower than the density of state of the valence band. Thus, the electrons moving in the conduction band are likely to be at a high energy level compared to the holes moving in the valence band. Therefore, as indicated by the arrows in the FIG. 6B, some of the electrons pass through the active layer 203 and move toward a p-ohmic electrode 210. To address this problem, an energy barrier is formed in the conduction band by the electron block layer 204 made of AlGaN having a high content of Al having a large energy band-gap to block the passage of the electrons.

However, a piezoelectric field due to tensile strain is induced in electron block layer 204 as described above. This deforms the band lineup in the periphery of the electron block layer 204. Thus, the effective height of the barrier is smaller than an actual band-gap difference. As a result, the passage of the electrons is insufficiently blocked.

To solve the above problem, the inventors focused attention on heat generation during operation of the nitride semiconductor light emitting element and the difference in thermal expansion coefficient between the nitride semiconductor light emitting element and the submount, and found the above-described configuration of the present embodiment.

The nitride semiconductor light emitting element 110 in an electrically conducting state causes self-heating due to reactive electric power which has not contributed to light emission, so that the temperature of the element rises. As a result, the nitride semiconductor light emitting element 110 attempts to expand according to the thermal expansion coefficient thereof (of the GaN substrate). On the other hand, the nitride semiconductor light emitting element 110 is adhered to the submount 111, and the volume of the submount 111 is about 10 times as large as that of the nitride semiconductor light emitting element 110. Thus, the thermal expansion of the nitride semiconductor light emitting element 110 at the time of the temperature rise is dominated by the thermal expansion coefficient of the material of the submount 111.

Therefore, the thermal expansion coefficient of the submount 111 is reduced to be smaller than the thermal expansion coefficient of the nitride semiconductor light emitting element 110, so that as illustrated in FIG. 5A, compression strain 222 can be induced in the nitride semiconductor light emitting element 110. The compression strain 222 is induced in a similar manner in each layers formed on the nitride semiconductor substrate 201. At this time, when attention is focused on the electron block layer 204 in the nitride semiconductor light emitting element 110, tensile strain 221 caused due to grid mismatch with respect to the substrate is reduced by the compression strain 222. That is, the tensile strain 221 caused in the electron block layer 204 is reduced, and a reduction in effective height of the barrier can be inhibited.

More specifically, description will be given with reference to the band lineup of the nitride semiconductor light emitting device 100 illustrated in FIG. 5B. The dotted line schematically indicates a band lineup in the case where it is assumed that the temperature of the nitride semiconductor light emitting device does not rise (thus, the volume of each portion is not changed due to the temperature). The solid line schematically indicates a band lineup in the case where the distortion is reduced by a temperature rise, and thus the piezoelectric field is reduced. The method described in the present embodiment can relieve the lattice mismatch strain (tensile strain) caused in the electron block layer 204, so that the effective height of the barrier can be increased.

Subsequently, a preferable embodiment of the configuration of the nitride semiconductor light emitting device will be more specifically described.

First, a material for forming the submount 111 preferably has a high thermal conductivity from the point of view of heat dissipation of the nitride semiconductor light emitting element 110. Heat generated in the nitride semiconductor light emitting element 110 is conducted through the submount 111 and discharged to an external heat sink via the element mounting board 122 and a base 121 of the stem. Thus, when the thermal conductivity of the submount 111 is low, the temperature of the nitride semiconductor light emitting element 110 increases, and heat saturation of light output easily occurs. In this case, the effect of the nitride semiconductor light emitting device 100 of the present embodiment cannot be obtained.

Table 1 and FIG. 7 show the thermal conductivities and the thermal expansion coefficients of the materials which have been first considered as the submount base of the nitride semiconductor light emitting device of the present embodiment.

TABLE 1

| Material | Thermal Conductivity [W/mK] | Thermal Expansion Coefficient [$\times 10^{-6}$/K] |
|---|---|---|
| AlN Ceramic | 60-230 | 4.4-4.6 |
| SiC Ceramic | 60-210 | 3.7-4.1 |
| High Thermal Conductivity SiC Ceramic | 320 | 3.7 |
| CVD-Diamond | 1500 | 2.2 |
| DC60 | 600 | 6 |
| Si | 150 | 2.6 |
| Cu | 390 | 17 |
| Mo | 159 | 5.1 |
| W | 167 | 4.5 |
| Cu/Mo Alloy | 160-290 | 7-13 |
| Cu/W Alloy | 180-230 | 6.5-8.3 |
| Invar (Fe/Ni Alloy) | 13.4 | 0.5-2 |
| (Reference) GaN | 130 | 5.6 |

The submount 111 of the nitride semiconductor light emitting element 110 has a configuration in which the submount base 111a is sandwiched between the first electrode 111d and the second electrode 111f which are made of a material having a high thermal expansion coefficient. Thus, an optimal submount base has to be selected. The considered materials will be described below.

The thermal conductivity of GaN from which the substrate of the nitride semiconductor light emitting element 110 is made is 130 W/mK. Thus, the submount material has to have a thermal conductivity at least higher than or equal to 130 W/mK.

Here, CVD-diamond is artificial diamond formed by chemical vapor deposition. CVD-diamond is a material having a very high thermal conductivity and a low thermal expansion coefficient. DC60 is a mixed sintered body of diamond and copper (Cu). DC60 also has a high thermal conductivity, but the thermal expansion coefficient of the DC60 is higher than the thermal expansion coefficient of GaN. SiC ceramic and MN ceramic, which are widely used generally as a submount material, each have a thermal expansion coefficient lower than GaN, but the thermal conductivity of each of the SiC ceramic and the MN ceramic is about 200 W/mK at most (depending on fabrication methods). Note that, the thermal conductivity of SiC ceramic can be increased by devising the fabrication method of the SiC ceramic, and it is possible to obtain a high thermal conductivity of 320 W/mK. Here, such material is distinguished as high heat dissipation SiC.

Subsequently, the effect on the characteristics of the nitride semiconductor light emitting device was verified by using submount base materials shown in Table 2 and selected based on the above-described consideration by comparison.

TABLE 2

| Material | Thermal Conductivity [W/mK] | Thermal Expansion Coefficient [×10⁻⁶/K] |
|---|---|---|
| AlN Ceramic | 230 | 4.5 |
| SiC Ceramic | 210 | 3.7 |
| High Thermal Conductivity SiC Ceramic | 320 | 3.7 |
| CVD-Diamond | 1500 | 2.2 |
| DC60 | 600 | 6 |

FIG. 8 and Table 3 show results of computation of the magnitude of strain applied to the electron block layer 204 when the submount base materials were used.

TABLE 3

Residual Strain [%] in $Al_{0.2}Ga_{0.8}N$ Electron Block Layer during Operation (Po = 5 W)

| Submount Material | Lattice mismatch strain | Thermal Strain during Operation | Residual Strain during Operation |
|---|---|---|---|
| AlN | 0.48 | −0.0043 | 0.476 |
| SiC | 0.48 | −0.0074 | 0.473 |
| High Thermal Conductivity SiC | 0.48 | −0.0074 | 0.473 |
| DC60 | 0.48 | 0.0016 | 0.482 |
| CVD-Diamond | 0.48 | −0.0133 | 0.467 |

+ Tensile Strain
− Compressive Strain

FIGS. 9, 10, and Table 4 show results of comparison of the characteristics of actually formed nitride semiconductor light emitting devices with each other.

TABLE 4

| Submount Material | Thermal Conductivity [W/mK] | Heat Resistance [K/W] | Maximum Light Output [W] |
|---|---|---|---|
| AlN | 230 | 13.9 | 4.3 |
| SiC | 210 | 14.1 | 4.5 |
| High Thermal Conductivity SiC | 320 | 13.0 | 5.0 |
| DC60 | 600 | 12.8 | 4.7 |
| CVD-Diamond | 1500 | 12.7 | 6.3 |

In the computation and the experiment, the electron block layer 204 of the nitride semiconductor light emitting device has a composition ratio of $Al_{0.2}Ga_{0.8}N$, and a thickness of 10 nm.

First, in FIG. 8, temperature dependency of the linear expansion coefficients of the submount base materials in Table 3 and GaN is shown. The linear expansion coefficients are indicated with reference to the room temperature (25° C.).

Here, when the nitride semiconductor light emitting device used in the experiment operates at a light output of 5 W, the chip temperature is computed at 64° C. It is assumed that the thermal expansion of the nitride semiconductor light emitting element 110 at this temperature is determined by the thermal expansion coefficient of the submount 111. In this case, thermal strain is newly applied to the AlGaN electron block layer 204 in the nitride semiconductor light emitting element 110.

In Table 3, the magnitudes of strain induced in the electron block layers in the case of using the submount bases are summarized. When high thermal conductivity SiC, CVD-diamond, SiC, or MN which has a lower thermal expansion coefficient than GaN is used, the lattice mismatch strain of the AlGaN electron block layer 204 is relieved by the thermal strain. In contrast, when DC60 having a high thermal expansion coefficient is used as the submount 111, the strain of the AlGaN electron block layer 204 is increased. From the result, it can be predicted elements with relieved lattice mismatch strain has an increased effective height of a barrier of the AlGaN electron block layer 204 and reduced carrier overflow, so that higher light output can be obtained.

Next, FIG. 9 shows results of comparison of the photoelectric conversion efficiency of nitride semiconductor light emitting devices 100 made of five types of materials, i.e., CVD-diamond, high thermal conductivity SiC, DC60, SiC, MN as submount bases 111a. Here, the nitride semiconductor light emitting devices 100 used in the experiment each include an AlGaN electron block layer 204 having a composition ratio of $Al_{0.2}Ga_{0.8}N$ and a thickness of 10 nm and a semiconductor laser array having five light waveguides.

From the results in FIG. 9, it can be seen that the maximum light output differs depending on the types of the submounts. In Table 4, the laser characteristics (maximum light output values) of the submount base materials are summarized. Here, heat resistance was obtained by determining the temperature dependency of the operating voltage of one of five emitters included in the laser array when a minute current is applied. It can be assumed that the difference in heat resistance caused by the difference between the submounts 111 reflects the difference in thermal conductivity of the submounts 111. However, it is not possible to explain the difference in maximum light output by the difference in thermal conductivity of the submounts 111. For example, when high thermal conductivity SiC and DC60 are compared with each other, the DC60 has a higher thermal conductivity, but the maximum light output is higher when the high thermal conductivity SiC submount is used.

FIG. 10 shows comparison of the relationship between the maximum light output values shown in FIG. 9 which are the results of the experiment and the submount thermal expansion coefficients with simulation results.

In FIG. 10, points plotted by black dots represent actual values, and points plotted by white circles represent the simulation results. The computation was performed with reference to actual data measured in the case of using AlN (thermal conductivity 230 W/mK) as the submount base 111a. It is also assumed that thermal strain equal to that in the case of using an AlN submount (thermal expansion coefficient of 4.5×10⁻⁶/K) is induced in the nitride semiconductor light emitting element. Under this condition, the temperature of the element was computed to obtain the maximum light output for each of the case where the submount is CVD-diamond (thermal conductivity 1500 W/mK), the case where the submount is DC60 (thermal conductivity 600 W/mK), the case where the submount is high thermal conductivity SiC (thermal conductivity 320 W/mK), and the case where the submount is normal SiC (thermal conductivity 210 W/mK).

As illustrated in FIG. 10, in each of the case of the CVD-diamond, the case of the high thermal conductivity SiC, and the case of the normal SiC, light output higher than the light output estimated based on the temperature of the element was obtained. In contrast, in the case of the DC60 used as the submount, only light output lower than the light output estimated based on the temperature of the element can be obtained.

In conventional GaAs-based semiconductor laser, a material that allows the thermal expansion coefficient of the submount to approximate to the thermal expansion coefficient of the nitride semiconductor light emitting element is often selected in order to avoid thermal strain. However, in the case of the nitride semiconductor light emitting element in which a piezoelectric field is induced as in the present embodiment, the difference in thermal expansion coefficient can be actively used. That is, when CVD-diamond or SiC having a low thermal expansion coefficient is used, the residual strain (tensile strain) of the AlGaN electron block layer 204 can be relieved by compressive thermal strain caused at the time when the temperature rises. As a result, the height of the barrier against electrons in the conduction band is increased. In contrast, when DC60 having a higher thermal expansion coefficient than GaN substrate is used as the submount, the tensile strain of the AlGaN electron block layer is increased, so that the height of the barrier against electrons in the conduction band is reduced. The maximum light output varies according to the increase/decrease in height of the barrier.

On the other hand, when the high thermal conductivity SiC submount and the normal SiC submount which have substantially equal thermal expansion coefficients are compared with each other, the difference in maximum light output resulting from the difference in the thermal conductivity between the high thermal conductivity SiC submount and the normal SiC submount is recognized That is, when the high thermal conductivity SiC submount having a high thermal conductivity is used, the temperature of the element can be reduced, so that high light output can be obtained.

Here, the comparison between DC60 and high thermal conductivity SiC should be noted. DC60 has a very high thermal conductivity of 600 W/mK, but only low light output was obtained compared to the case of the high thermal conductivity SiC submount. This shows that when a submount having a thermal conductivity higher than 300 W/mK is used, the magnitude of the thermal expansion coefficient has a greater influence on the light output than the magnitude of the thermal conductivity.

These results show that for a submount having a thermal conductivity higher than or equal to 300 W/mK, a material having a thermal expansion coefficient lower than or equal to $4 \times 10^{-6}$/K (corresponding to the hatched region in FIG. 7) is preferably selected. There are few single material corresponding to the region other than the CVD-diamond used in the present embodiment. However, a material corresponding to the region can be created by using a composite material such as DC60 obtained by combining different materials. For example, DC60 is a composite material of diamond and copper (Cu), and the thermal expansion coefficient can be further reduced by changing the component ratio of the diamond and the copper (e.g., by increasing the ratio of the diamond).

From the results of the experiment and study in the above description, it was concluded as follows. In the case of materials having an internal electric field due to the piezoelectric effect, the barrier height of the barrier layer can be effectively increased by relieving the lattice mismatch strain of the barrier layer (electron block layer) which contributes to confinement of carriers in the active layer.

The technique of the present disclosure introduces an AlGaN electron block into the light emitting element structure formed on the GaN substrate. In this case, the lattice mismatch strain in the pulling direction is induced in the electron block layer. Thus, the element is mounted to a material having a low thermal expansion coefficient, so that the thermal strain which occurs during electric conduction can relieve the lattice mismatch strain. As a result, the barrier height of the electron block layer is effectively increased, thereby increasing the light output.

To obtain the effect, the thermal expansion coefficient of the submount material is preferably lower than the thermal expansion coefficient of the nitride semiconductor light emitting element. This is because the thermal strain caused due to a temperature rise during electric conduction can alleviate the grid mismatch in the electron block layer.

In the case of a nitride semiconductor light emitting element formed on a GaN substrate, when the thermal expansion coefficient of the submount is lower than or equal to $3 \times 10^{-6} K^{-1}$, the effect of increasing the light output is more significantly obtained. Moreover, the effect is significant in particular in the case of the light emitting element having a large amount of heat generation during electric conduction. For example, the effect is significant in particular to increase the output of an element whose reactive electric power which does not contribute to light emission, that is, the amount of heat generation (Joule heat) of the element exceeds 3 W.

On the other hand, the fabrication cost of materials such as the above-described CVD-diamond and the high thermal conductivity SiC having a high thermal conductivity and a low thermal expansion coefficient is generally high. Thus, such materials are difficultly applied to products such as semiconductor lasers which are expected to be mass-produced.

Therefore, the inventors found that the CVD-diamond or the high thermal conductivity SiC is limitedly used to part of the submount, so that the light output can be increased with the fabrication cost being reduced. That is, the inventors found that the nitride semiconductor light emitting device of the present embodiment illustrated in FIGS. 1-3 can achieve both the reduction in fabrication cost and the increase in light output at high level.

In the nitride semiconductor light emitting device of the present embodiment illustrated in FIGS. 1-3, a portion of the submount 311 close to the nitride semiconductor light emitting element, i.e., the first submount base 311a is made of a material having a low thermal expansion coefficient. With this structure, it is possible to effectively apply compressive thermal strain to the nitride semiconductor light emitting element 310 at the time when the temperature rises due to electric conduction.

At this time, in order to effectively apply the compression strain to the nitride semiconductor light emitting element 310, the volume of the first submount base 311a has to be larger than at least the volume of the nitride semiconductor light emitting element 310. For example, the nitride semiconductor light emitting element 310 used in the present embodiment has a length of 800 μm, a width of 1000 μm, and a thickness of 80 μm. The volume of the nitride semiconductor light emitting element 310 is 0.064 mm$^3$. The submount 311 has a length of 1300 μm, a width of 1400 μm, and a thickness of 200 μm. In the submount 311, the first submount base 311a made of CVD-diamond has a thickness of 50 μm. The second submount base 311b, i.e., the other portion of the submount 311 having a thickness of 150 μm, is made of AlN. The volume of the first submount base 311a is 0.091 mm$^3$, is sufficiently larger than the volume of the nitride semiconductor light emitting element 310, and can effectively apply the compression strain to the nitride semiconductor light emitting element 310 due to a temperature rise during electric conduction. As a result, an effect similar to that obtained by using a single submount made of CVD-diamond, i.e., improvement in light output as illustrated in FIG. 9 can be obtained.

In the present embodiment, CVD-diamond is used for the first submount base 311a, but the first submount base 311a may be made of other materials. Any material can be used as long as the material has a thermal expansion coefficient lower than or equal to $4\times10^{-6}\text{K}^{-1}$ and a thermal conductivity greater than or equal to 300 W/mK. The above-described high thermal conductivity SiC can be used for the first submount base 311a, or it is possible to use a material obtained by increasing the ratio of diamond in DC60 so that the thermal expansion coefficient of the DC60 is within the above-described range.

In the present embodiment, AlN is used for the second submount base 311b, but the second submount base 311b may be made of other materials. Any material can be used as long as the material has a lower thermal expansion coefficient than the substrate of the nitride semiconductor light emitting element and a certain high thermal conductivity. For example, SiC can also be used for the second submount base 311b. In this case, the thermal expansion coefficient of the first submount base 311a is preferably lower than the thermal expansion coefficient of the second submount base 311b. The volume of the second submount base 311b is preferably larger than the volume of the first submount base 311a in order to reduce fabrication costs.

(Second Embodiment)

Next, a second embodiment of the present disclosure will be described.

Figure 11:
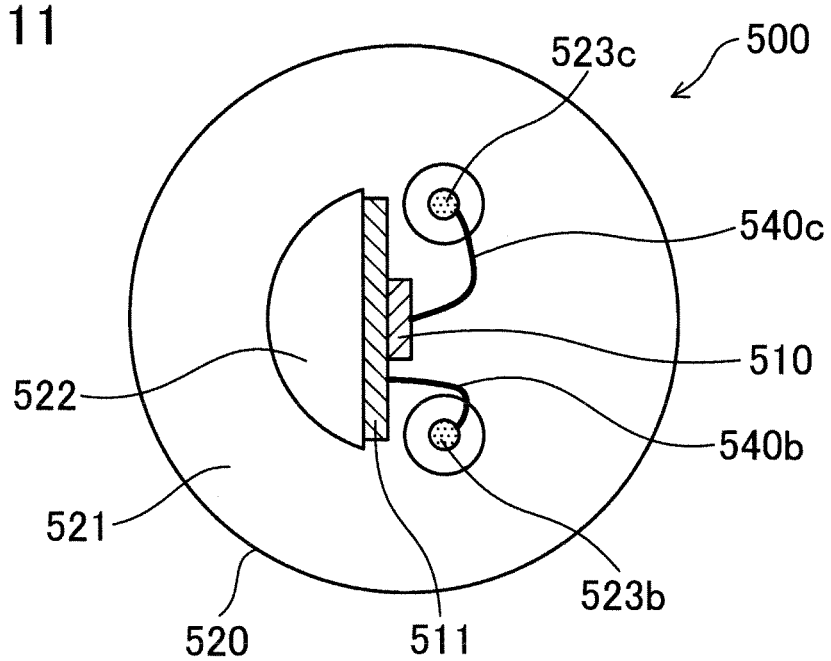
FIG. 11 is a top view illustrating a configuration of a nitride semiconductor light emitting device of a second embodiment.

FIG. 11 is a top view illustrating a nitride semiconductor light emitting device 500 of the second embodiment as seen from a direction in which light is emitted. The cross-sectional shape and components of the nitride semiconductor light emitting device 500 are identical with those of the nitride semiconductor light emitting device 100 and the nitride semiconductor light emitting device 300 of the first embodiment illustrated in FIGS. 1, 2, 3, and 4. In FIG. 11, the cap is not illustrated for the sake of simplicity of the drawings. The structure of a nitride semiconductor light emitting element 510 is identical with that of the first embodiment.

Figure 12:
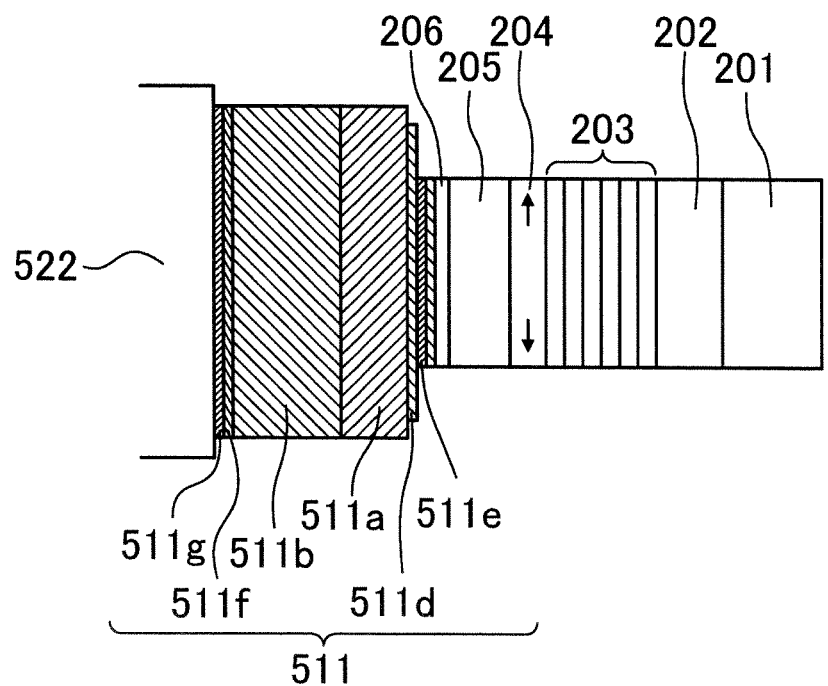
FIG. 12 is a cross-sectional view illustrating a configuration of a nitride semiconductor light emitting element of the second embodiment.

Next, FIG. 12 is an enlarged view schematically illustrating a structure in the periphery of the nitride semiconductor light emitting element 510. The configuration of a submount 511 is also identical with that of the submount 311 illustrated in FIG. 10.

That is, a first submount base 511a connected to the nitride semiconductor light emitting element 510 is made of CVD-diamond, and a second submount base 511b connected to an element mounting board 522 is made of MN whose fabrication cost is low. A first electrode 511d and a second electrode 511f each having a metal stacked structure obtained by stacking, for example, a Ti layer having a thickness of 0.1 µm, a Pt layer having a thickness of 0.2 µm, an Au layer having a thickness of 0.2 µm are formed on the surface and the back face of the submount 511. A first adhesion section 511e which is, for example, an AuSn eutectic solder is formed on the first electrode 511d to adhere the nitride semiconductor light emitting element 510 to the submount 511. Moreover, a second adhesion section 511g which is, for example, an AuSn eutectic solder is formed on the second electrode 511f of the submount 511 to adhere the submount 511 to the element mounting board 522 of a stem 520.

In the above configuration, the thicknesses of the first submount base 511a and the second submount base 511b are 10 times as large as the thicknesses of the first electrode 511d and the second electrode 511f, respectively. Thus, the thermal expansion coefficients of the two submount bases 511a, 511b predominate in the thermal expansion coefficient of the submount 511.

The nitride semiconductor light emitting device 500 of the present embodiment is different from that of the first embodiment in the following two points.

First, as illustrated in FIG. 12, unlike the first embodiment, a surface of the nitride semiconductor light emitting element 510 close to a p-GaN clad layer 205 is adhered to the submount 511. Moreover, the submount 511 is adhered to the element mounting board 522 of the stem.

With this configuration, heat generated from the nitride semiconductor light emitting element 510 is released to a heat sink through the submount 511 and the element mounting board 522. In the nitride semiconductor light emitting element 510, large part of heat is generated in a portion extending from a MQW active layer to the p-GaN clad layer. This is because the electrical resistance of a crystalline layer in the portion is high, which increases ohmic loss due to electric conduction. Thus, when the surface close to the p-GaN clad layer 205 is adhered to the submount 511, a heat dissipation route to the heat sink is shortened, thereby reducing heat resistance.

The second difference of the present embodiment from the first embodiment is the shape of the element mounting board 522. A lead 523b and a lead 523c are displaced to the right with respect to the structure of FIG. 2 (in a direction away from the element mounting board 522), and the cross-sectional area of the element mounting board 522 as seen from a direction of the upper surface of the element mounting board 522 is increased. This increases the cross-sectional area of the heat dissipation route, thereby reducing the heat resistance.

With these two effects, a temperature rise of the nitride semiconductor light emitting element 510 during electric conduction is limited, so that it is possible to obtain high light output. Here, the relationship between the thermal expansion coefficient of the submount and the maximum light output is similar to that of first embodiment. That is, the maximum light output can be increased by using a submount having a low thermal expansion coefficient.

(Third Embodiment)

Next, a third embodiment of the present disclosure will be described.

Figure 13:
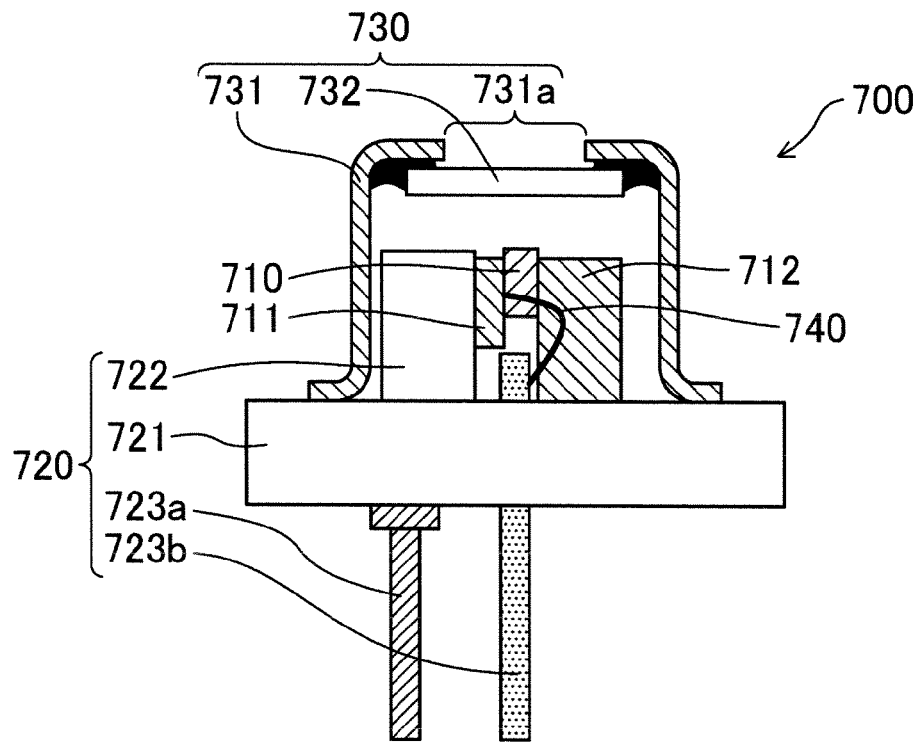
FIG. 13 is a cross-sectional view illustrating a nitride semiconductor light emitting device of a third embodiment.
Figure 14:
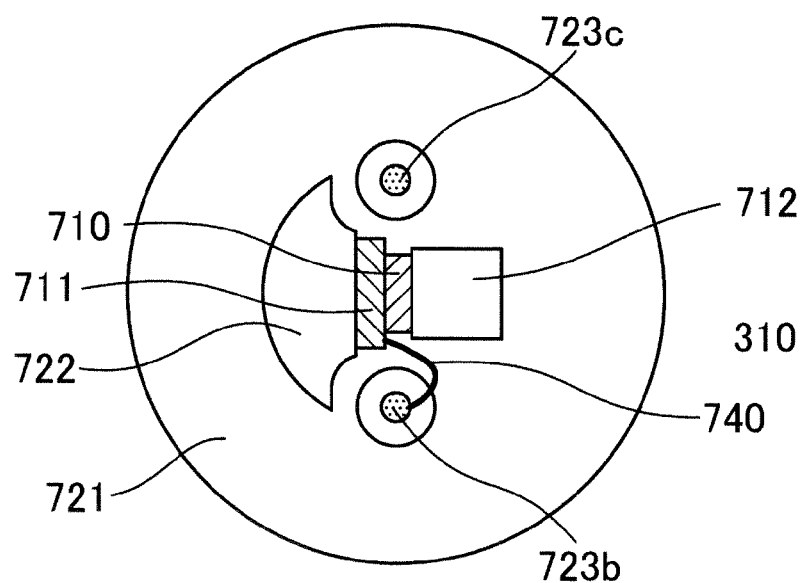
FIG. 14 is a top view illustrating a configuration of the nitride semiconductor light emitting device of the third embodiment.

FIG. 13 is a cross-sectional view of an example nitride semiconductor light emitting device 700 of the third embodiment. FIG. 14 is a top view of the nitride semiconductor light emitting device 700. The present embodiment includes a second submount 712.

A nitride semiconductor light emitting element 710 is mounted to an element mounting board 722 of a stem 720 together with a submount 711. Here, a positive electrode of the nitride semiconductor light emitting element 710 is connected to the submount 711. A metal layer is formed on a surface of the submount 711, and the metal layer is electrically connected to a lead 723b via a bonding wire 740.

On the other hand, the second submount 712 is adhered to a surface of the nitride semiconductor light emitting element 710 opposite to the submount 711. The second submount 712 connects a negative electrode of the nitride semiconductor light emitting element 710 to a base 721 of the stem 720. A metal layer is also formed on a surface of the second submount 712. The negative electrode of the nitride semiconductor light emitting element 710 is electrically connected to the base 721 of the stem 720. When a lead pin 723a for ground is used as the negative electrode, and the lead 723b is used as the positive electrode, a current can conducted through the nitride semiconductor light emitting element 710. Conversely, the negative electrode of the nitride semiconductor light emitting element 710 may be connected to the submount 711, and the positive electrode of the nitride semiconductor light emitting element 710 may be connected to the second submount 712. In this case, the lead pin 723a for ground is used as the positive electrode, and the lead 723b is used as the negative electrode.

In the present embodiment, the second submount 712 is connected to the nitride semiconductor light emitting element 710, so that a heat dissipation route from the nitride semiconductor light emitting element 710 can be added. As a result, heat resistance is significantly reduced, and thus a temperature rise of the nitride semiconductor light emitting element 710 during electric conduction can be effectively limited.

Similar to the first embodiment, this configuration can also increase the maximum light output by using a submount having a low thermal expansion coefficient. The second submount 712 is not necessarily made of the same material as the submount 711, but a material having a low thermal expansion coefficient (in particular, a lower thermal expansion coefficient than the nitride semiconductor light emitting element) is preferably selected. Here, the submount 711 and the second submount 712 are not necessarily made of a single material. That is, similar to the first embodiment, CVD-diamond or high thermal conductivity SiC having a low thermal expansion coefficient may be used for portions of the submount 711 and the second submount 712 which are connected to the nitride semiconductor light emitting element 710.

The thermal expansion of the nitride semiconductor light emitting element 710 during electric conduction strongly depends on the thermal expansion coefficient of the second submount 712. Selecting a material having a low thermal expansion coefficient can relieve the lattice mismatch strain of the electron block layer at the time of the temperature rise, which can increase the maximum light output.

(Fourth Embodiment)

Next, a fourth embodiment of the present disclosure will be described.

Figure 15:
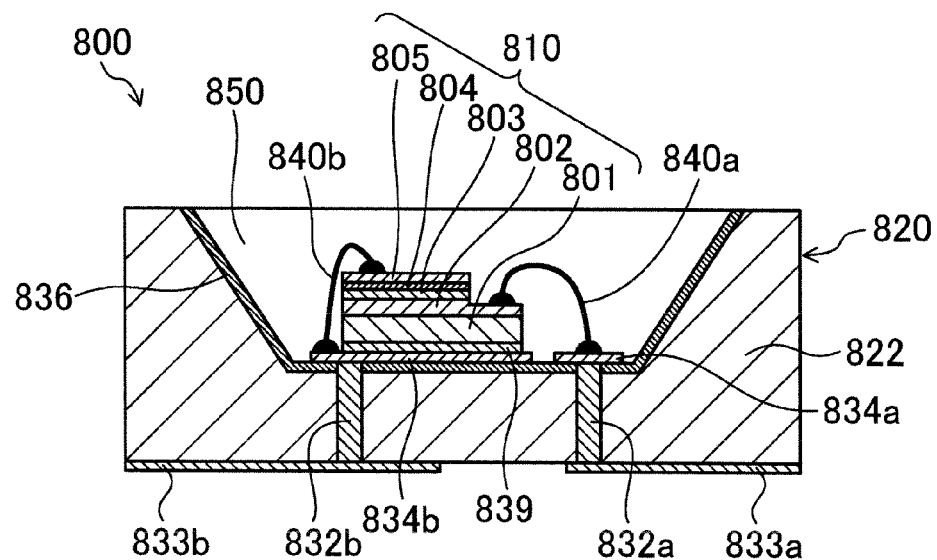
FIG. 15 is a cross-sectional view illustrating a configuration of a nitride semiconductor light emitting device of a fourth embodiment.

FIG. 15 is a cross-sectional view illustrating an example nitride semiconductor light emitting device 800 of the fourth embodiment.

The nitride semiconductor light emitting device 800 includes a nitride semiconductor light emitting element 810 and a package 820.

The nitride semiconductor light emitting element 810 includes a GaN substrate 801, an n-clad layer 802, a MQW active layer 803, a p-AlGaN electron block layer 804, and a p-clad layer 805. Part of the n-clad layer 802 of the nitride semiconductor light emitting element 810 is exposed by dry etching.

On the other hand, the package 820 includes an insulative base 822, a reflection film 836 configured to reflect light from the nitride semiconductor light emitting element 810 in a direction of an upper surface of the package 820, back electrodes 833a and 833b, top electrodes 834a and 834b, and via interconnects 832a and 832b configured to connect the back electrodes to the top electrodes.

The nitride semiconductor light emitting element 810 is mounted to the package 820 via an adhesion section 839. A p electrode (not shown) of the nitride semiconductor light emitting element 810 is electrically connected to the top electrode 834b via a bonding wire 840b. An n electrode (not shown) of the nitride semiconductor light emitting element 810 is electrically connected to the top electrode 834a via a bonding wire 840a. The back electrodes 833a and 833b are respectively connected to a negative electrode and a positive electrode for electric conduction, so that the nitride semiconductor light emitting element 810 can emit light. The nitride semiconductor light emitting device 800 is completed by finally encapsulating the nitride semiconductor light emitting element 810 with fluorescent material-containing resin 850. The nitride semiconductor light emitting element 810 which emits blue light and the fluorescent material-containing resin 850 which emits yellow fluorescence are used, so that the nitride semiconductor light emitting device 800 which emits white light is provided.

With this configuration, heat generated in the nitride semiconductor light emitting element 810 is transmitted to the outside through the package base 822. Thus, a material having a high thermal conductivity is preferably used for the base 822. Thermal strain generated in the nitride semiconductor light emitting element 810 during electric conduction is determined by the thermal expansion coefficient of the base 822. Thus, similar to the submount of the first embodiment, a portion of the base 822 which is connected to the nitride semiconductor light emitting element 810 is made of CVD-diamond or high thermal conductivity SiC having a low thermal expansion coefficient and a high thermal conductivity. Thus, the effect of reducing the carrier overflow of the electron block layer 804 is increased. As a result, high light output can be obtained.

(Variation of Fourth Embodiment)

Figure 16:
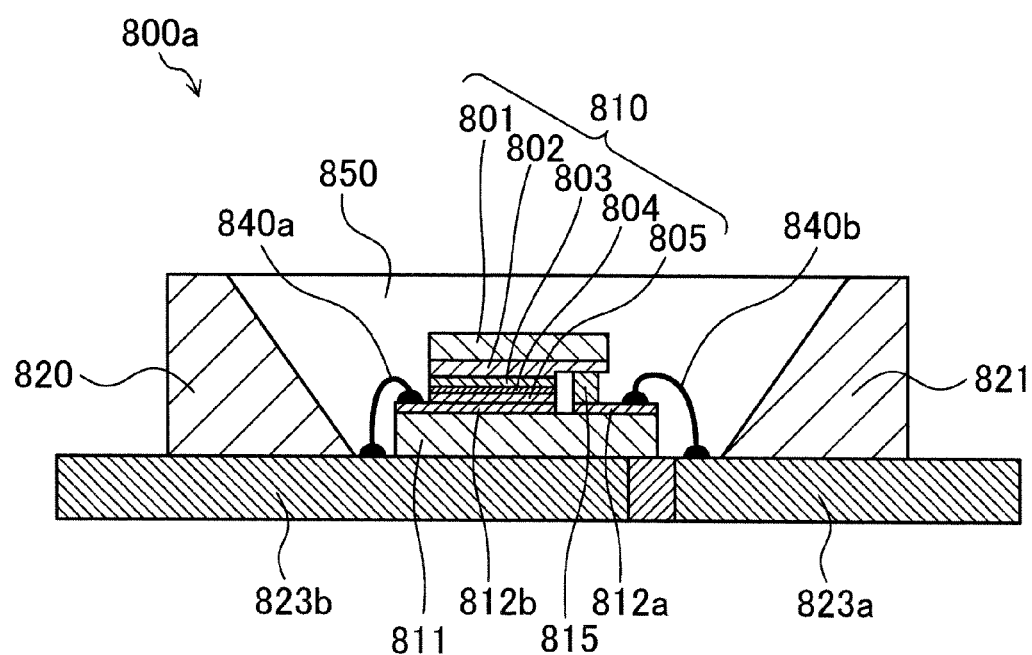
FIG. 16 is a cross-sectional view illustrating a variation of the configuration of the nitride semiconductor light emitting device of the fourth embodiment.
Figure 17A:
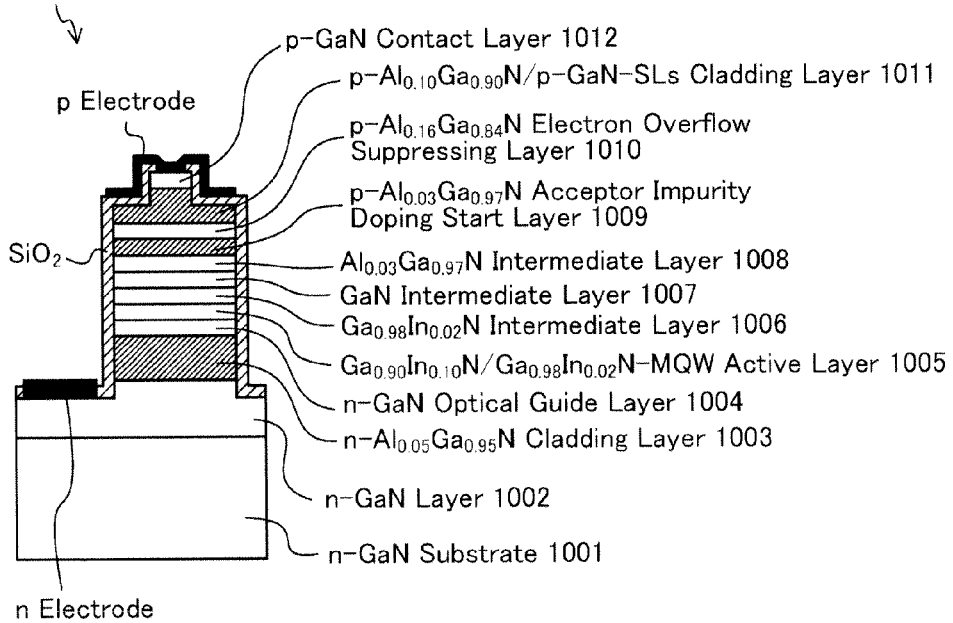
FIGS. 17A and 17B are views illustrating a conventional nitride semiconductor light emitting device.
Figure 17B:
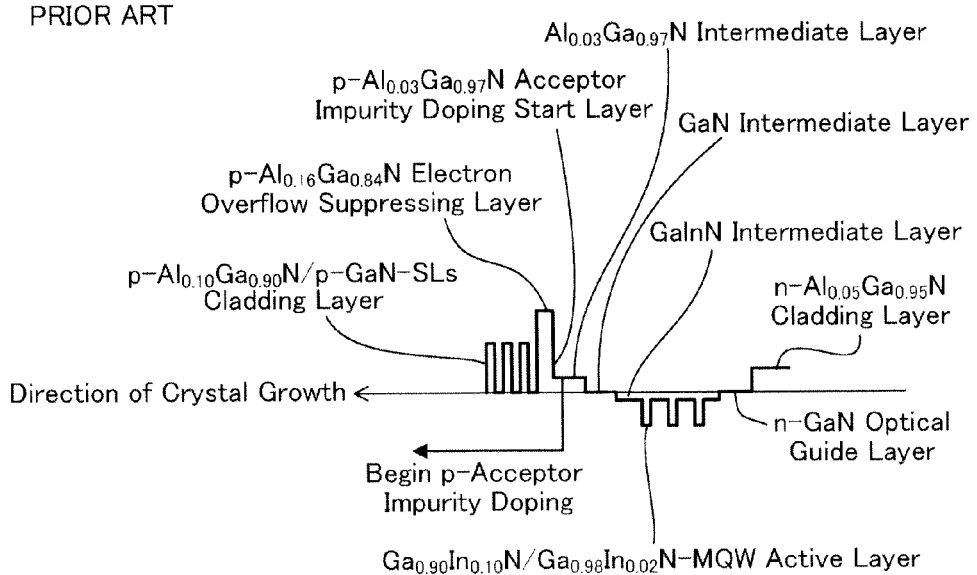

FIG. 16 is a cross-sectional view illustrating a variation of the fourth embodiment.

A nitride semiconductor light emitting device 800a of the present variation includes a nitride semiconductor light emitting element 810, a package 820, and a submount 811.

The nitride semiconductor light emitting element 810 is identical with that of FIG. 15. The package 820 includes a resin base 821 and metal leads 823a and 823b electrically isolated from each other by the resin base 821. The nitride semiconductor light emitting element 810 is connected to the submount 811 and mounted to the package 820 together with the submount 811. Top electrodes 812a and 812b are formed on a surface of the submount 811. A p electrode of the nitride semiconductor light emitting element 810 is connected to the top electrode 812b, and an n electrode of the nitride semiconductor light emitting element 810 is connected to the top electrode 812a via a bump electrode 815. The top electrodes 812a and 812b are electrically connected to the metal leads 823a and 823b via bonding wires 840a and 840b, respectively. The metal leads 823a and 823b are respectively connected to a negative electrode and a positive electrode for electric conduction, so that the nitride semiconductor light emitting element 810 can emit light. The nitride semiconductor light emitting device 800 is completed by encapsulating the nitride semiconductor light emitting element 810 with fluorescent material-containing resin 850. The nitride semiconductor light emitting element 810 which emits blue light and the fluorescent material-containing resin 850 which emits yellow fluorescence are used, so that the nitride semiconductor light emitting device 800 which emits white light is provided.

With this configuration, heat generated in the nitride semiconductor light emitting element 810 is transmitted to the outside through the submount 811 and the metal lead 823b. Thus, a material having a high thermal conductivity is preferably used for the submount 811. Thermal strain generated in the nitride semiconductor light emitting element 810 during electric conduction is determined by the thermal expansion coefficient of the submount 811. Thus, similar to the submount of the first embodiment, a portion of the submount 811 which is connected to the nitride semiconductor light emitting element 810 is made of CVD-diamond or high thermal conductivity SiC having a low thermal expansion coefficient and a high thermal conductivity. Thus, the effect of reducing the carrier overflow of the electron block layer 804 is increased. As a result, high light output can be obtained.

In the fourth embodiment illustrated in FIG. 15, CVD-diamond or SiC is used as a material for the package base 822.

In contrast, in the present variation, such materials can be used for the submount 811. The submount is a simple rectangular parallelepiped, and has thus the advantage that the submount can be easily processed.

As described above, a nitride semiconductor light emitting element including an electron block layer having lattice mismatch strain in a pulling direction is mounted to a submount having a low thermal expansion coefficient, so that the light output can be increased. The shape of the submount may be a simple rectangular parallelepiped, and complicated mechanical processing is not required. Thus, it is possible to use a material having low processability such as artificial diamond as described in the present embodiment. Conventional stems or caps can be used without modification, and thus the nitride semiconductor light emitting device can be easily mounted to conventional light sources using nitride semiconductor light emitting devices.

The nitride semiconductor light emitting device of the present disclosure is effectively used in devices which requires relatively high light output such as image display devices (e.g., laser displays and projectors) and industrial laser apparatuses for laser processing, laser annealing, etc. The nitride semiconductor light emitting element used in the nitride semiconductor light emitting device is not only applicable to semiconductor lasers but also widely applicable to devices including not only semiconductor laser but also light emitting diodes.

What is claimed is:

1. A semiconductor light emitting device comprising:
    a nitride semiconductor light emitting element including a nitride semiconductor substrate having a polar or semipolar surface and a nitride semiconductor multilayer film stacked on the polar or semipolar surface; and
    a mounting section to which the nitride semiconductor light emitting element is mounted, wherein
    the nitride semiconductor multilayer film includes an electron block layer,
    a lattice constant of the electron block layer is smaller than a lattice constant of the nitride semiconductor substrate,
    the mounting section includes at least a first mounting section base,
    a thermal expansion coefficient of the first mounting section base is lower than a thermal expansion coefficient of the nitride semiconductor multilayer film, and
    a thermal conductivity of the first mounting section base is higher than a thermal conductivity of the nitride semiconductor multilayer film,
    an amount of heat generation in the nitride semiconductor light emitting element is greater than or equal to 3 W,
    the heat generation during an operation of the nitride semiconductor light emitting element induces compression strain in the nitride semiconductor multilayer film to increase effective height of the electron block layer, the compression strain being induced due to a thermal expansion coefficient of the nitride semiconductor light emitting element, and the thermal expansion coefficient of the first mounting section base,
    the mounting section has a first face and a second face opposite to the first face,
    the nitride semiconductor light emitting element is disposed on the first face,
    a first electrode is disposed on the first face, and a second electrode is disposed on the second face, and
    a thickness of the mounting section is 10 times as large as or larger than a sum of thicknesses of the first and second electrodes.

2. The semiconductor light emitting device of claim 1, wherein
    the thermal expansion coefficient of the first mounting section base is lower than or equal to $4 \times 10^{-6} K^{-1}$, and
    the thermal conductivity of the first mounting section base is higher than or equal to 300 W/mK.

3. The semiconductor light emitting device of claim 1, wherein
    the mounting section includes a second mounting section base made of a material different from a material of the first mounting section base and connected to the first mounting section base, and
    the first mounting section base is located closer to the nitride semiconductor light emitting element than the second mounting section base is.

4. The semiconductor light emitting device of claim 1, wherein the first mounting section base is made of high thermal conductivity SiC ceramic, CVD-diamond, or a composite material of diamond and copper.

5. The semiconductor light emitting device of claim 1, wherein the thermal expansion coefficient of the first mounting section base is lower than or equal to $3 \times 10^{-6} K^{-1}$.

6. The semiconductor light emitting device of claim 1, wherein the nitride semiconductor light emitting element is a light emitting diode.

7. The semiconductor light emitting device of claim 3, wherein the thermal expansion coefficient of the first mounting section base is lower than a thermal expansion coefficient of the second mounting section base.

8. The semiconductor light emitting device of claim 1, wherein a volume of the first mounting section base is larger than a volume of the nitride semiconductor light emitting element.

9. The semiconductor light emitting device of claim 1, wherein the mounting section is a submount mounted to an element mounting board or a base.

10. The semiconductor light emitting device of claim 1, wherein the first mounting section base is an uppermost mounting section base of the mounting section.

11. The device of claim 1, wherein a volume of the mounting section is approximately 10 times as large as a volume of the nitride semiconductor light emitting element.

12. The device of claim 1, wherein the thickness of the mounting section is 20 times as large as or larger than the sum of the thicknesses of the first and second electrodes.

* * * * *